(12) United States Patent
Scardera et al.

(10) Patent No.: US 8,420,517 B2
(45) Date of Patent: Apr. 16, 2013

(54) METHODS OF FORMING A MULTI-DOPED JUNCTION WITH SILICON-CONTAINING PARTICLES

(75) Inventors: Giuseppe Scardera, Sunnyvale, CA (US); Shihai Kan, San Jose, CA (US); Maxim Kelman, Mountain View, CA (US); Dmitry Poplavskyy, San Jose, CA (US)

(73) Assignee: Innovalight, Inc., Sunnyvale, CA (US)

( * ) Notice: Subject to any disclaimer, the term of this patent is extended or adjusted under 35 U.S.C. 154(b) by 437 days.

(21) Appl. No.: 12/656,710

(22) Filed: Feb. 12, 2010

(65) Prior Publication Data

US 2011/0003465 A1 Jan. 6, 2011

Related U.S. Application Data

(63) Continuation-in-part of application No. 12/692,878, filed on Jan. 25, 2010.

(60) Provisional application No. 61/222,628, filed on Jul. 2, 2009.

(51) Int. Cl.
*H01L 21/22* (2006.01)
*H01L 21/38* (2006.01)

(52) U.S. Cl.
USPC ............. 438/549; 438/548; 438/558; 438/75; 438/542; 257/E27.123; 257/E27.124; 257/E27.133; 257/E25.007; 136/252; 136/261

(58) Field of Classification Search .............. 438/75–77, 438/542–569; 257/E27.123–E27.126, E25.007, 257/E27.124, E27.133; 136/252–258, 261
See application file for complete search history.

(56) References Cited

U.S. PATENT DOCUMENTS 4,068,018 A 1/1978 Hashimoto et al.
4,445,267 A 5/1984 De La Moneda et al.
(Continued)

OTHER PUBLICATIONS

U.S. Appl. No. 13/099,794, filed May 3, 2011, Kelman et al.
(Continued)

*Primary Examiner* — Kimberly Rizkallah
*Assistant Examiner* — Maria Ligai
(74) *Attorney, Agent, or Firm* — Foley & Lardner LLP

(57) ABSTRACT

A method of forming a multi-doped junction on a substrate is disclosed. The method includes providing the substrate doped with boron atoms, the substrate comprising a front substrate surface. The method further includes depositing an ink on the front substrate surface in a ink pattern, the ink comprising a set of silicon-containing particles and a set of solvents. The method also includes heating the substrate in a baking ambient to a first temperature and for a first time period in order to create a densified film ink pattern. The method further includes exposing the substrate to a dopant source in a diffusion furnace with a deposition ambient, the deposition ambient comprising $POCl_3$, a carrier $N_2$ gas, a main $N_2$ gas, and a reactive $O_2$ gas at a second temperature and for a second time period, wherein a PSG layer is formed on the front substrate surface and on the densified film ink pattern; and heating the substrate in a drive-in ambient to a third temperature; wherein a first diffused region with a first sheet resistance is formed under the front substrate surface covered by the densified film ink pattern, and a second diffused region with a second sheet resistance is formed under the front substrate surface not covered with the densified film ink pattern, and wherein the first sheet resistance is substantially smaller than the second sheet resistance.

20 Claims, 10 Drawing Sheets

U.S. PATENT DOCUMENTS

| | | | |
|---|---|---|---|
| 5,627,081 | A | 5/1997 | Tsuo et al. |
| 5,656,556 | A | 8/1997 | Yang |
| 6,130,380 | A | 10/2000 | Nakamura |
| 6,171,975 | B1 | 1/2001 | Hase et al. |
| 6,461,901 | B1 | 10/2002 | Noguchi |
| 7,135,350 | B1 | 11/2006 | Smith et al. |
| 7,192,873 | B1 | 3/2007 | Kim et al. |
| 7,355,238 | B2 | 4/2008 | Takata et al. |
| 7,411,255 | B2 | 8/2008 | Parekh et al. |
| 7,615,393 | B1 | 11/2009 | Shah et al. |
| 8,236,598 | B2 | 8/2012 | Khadilkar et al. |
| 2003/0134469 | A1* | 7/2003 | Horzel et al. ............ 438/249 |
| 2005/0176164 | A1 | 8/2005 | Gee et al. |
| 2006/0096635 | A1 | 5/2006 | Tuttle |
| 2006/0211187 | A1 | 9/2006 | Choi et al. |
| 2007/0158621 | A1 | 7/2007 | Sakamoto et al. |
| 2007/0246689 | A1 | 10/2007 | Ge et al. |
| 2008/0044964 | A1* | 2/2008 | Kamath et al. ........... 438/164 |
| 2008/0111206 | A1 | 5/2008 | Hanoka et al. |
| 2008/0138966 | A1 | 6/2008 | Rogojina et al. |
| 2008/0146005 | A1 | 6/2008 | Lemmi et al. |
| 2008/0160265 | A1 | 7/2008 | Hieslmair et al. |
| 2008/0182390 | A1 | 7/2008 | Lemmi et al. |
| 2008/0283120 | A1* | 11/2008 | Komatsu et al. ........... 136/258 |
| 2008/0302660 | A1 | 12/2008 | Kahn et al. |
| 2009/0017606 | A1 | 1/2009 | Fath et al. |
| 2009/0020156 | A1 | 1/2009 | Ohtsuka et al. |
| 2009/0020158 | A1 | 1/2009 | Ohtsuka et al. |
| 2009/0239330 | A1 | 9/2009 | Vanheusden et al. |
| 2009/0239363 | A1 | 9/2009 | Leung et al. |
| 2009/0269913 | A1 | 10/2009 | Terry et al. |
| 2010/0015749 | A1 | 1/2010 | Borden |
| 2010/0015750 | A1* | 1/2010 | Shen et al. ............ 438/72 |
| 2010/0035422 | A1* | 2/2010 | Leung et al. ............ 438/558 |
| 2010/0294349 | A1 | 11/2010 | Srinivasan et al. |
| 2011/0203659 | A1 | 8/2011 | Carroll et al. |
| 2012/0100666 | A1 | 4/2012 | Gee et al. |

OTHER PUBLICATIONS

U.S. Appl. No. 13/172,040, filed Jun. 29, 2011, Abbott et al.
U.S. Appl. No. 13/238,252, filed Sep. 21, 2011, Scardera et al.
International Search Report and Written Opinion dated Oct. 21, 2011, in PCT/US2011/042330, 9 pages.
Altermatt et al., "Rear surface passivation of high-efficiency silicon solar cells by a floating junction," J. Appl. Phys., Sep. 15, 1996, 80(6):3574-3586.
Blakers et al., "22.8% efficient silicon solar cell," Appl. Phys. Lett., Sep. 25, 1989, 55(13):1363-1365.
Wang et al., "24% efficient silicon solar cells," Appl. Phys. Lett., Aug. 6, 1990, 57(6):602-604.
International Search Report and Written Opinion mailed May 27, 2011, in PCT/US2011/22377, 13 pages.
U.S. Appl. No. 12/794,188, filed Jun. 4, 2010, Scardera et al.
International Search Report and Written Opinion mailed Sep. 2, 2010, in PCT/US2010/040623, 10 pages.
International Search Report and Written Opinion mailed Sep. 16, 2011, in PCT/US2011/038359, 14 pages.
International Search Report and Written Opinion dated Jan. 27, 2011, in PCT/US2010/057782, 14 pages.
International Search Report and Written Opinion dated Mar. 18, 2011, in PCT/US2011/022107, 8 pages.
Dauwe et al., "Experimental Evidence of Parasitic Shunting in Silicon Nitride Rear Surface Passivated Solar Cells," Progress in Photovoltaics: Research and Applications, 2002, 10:271-278.
Honsberg et al., "685 mV Open-circuit voltage laser grooved silicon solar cell," Solar Energy Materials and Solar Cells, 1994, 34:117-123.
Hubbard et al., "Thermodynamic stability of binary oxides in contact with silicon," J. Mater. Res., Nov. 1996, 11(11):2757-2776.
Trupke et al., "Photoluminescence imaging of silicon wafers," Applied Physics Letters, 2006, 89:044107-1 to 044107-3.
Wang et al., "24% efficient silicon solar cells," Appl. Phys. Lett., Aug. 6, 1990, 57(6):602-604.
U.S. Appl. No. 12/692,878, filed Jan. 25, 2010, Scardera et al.
U.S. Appl. No. 12/626,198, filed Nov. 25, 2009, Kelman et al.
U.S. Appl. No. 12/506,811, filed Jul. 21, 2009, Scardera et al.
Bentzen et al., "Understanding phosphorus emitter diffusion in silicon solar cell processing," Proceedings of the 21$^{st}$ European Photovoltaic Solar Energy Conference, Dresden, Germany, 2006, 1388-1391.
Bultman et al., Ideal Single Diffusion Step Selective Emitters: A Comparison Between Theory and Practice, European Photovoltaic Solar Energy Conference and Exhibition, Munich, 2001, 6 pages.
Drabczyk et al., The influence of porous silicon on junction formation in silicon solar cells, Solar Energy Materials & Solar Cells, 2003, 76:545-551.
Gonzalez-Diaz et al., Low-porosity porous silicon nanostructures on monocrystalline silicon solar cells, Physica E, 2007, 38:215-218.
Jones, Scotten W., Diffusion in Silicon, IC Knowledge LLC, 2000, 71 pages.
Moon et al., Selective emitter using porous silicon for crystalline silicon solar cells, Solar Energy Materials & Solar Cells, 2008, 5 pages.
Voyer et al., "Progress in the Use of Sprayed Phosphoric Acid as an Inexpensive Dopant Source for Industrial Solar Cells," 20$^{th}$ European Photovoltaic Solar Energy Conference, Jun. 2005, 4 pages.

* cited by examiner

METHODS OF FORMING A MULTI-DOPED JUNCTION WITH SILICON-CONTAINING PARTICLES

CROSS-REFERENCE TO RELATED APPLICATIONS

This application claims the benefit of U.S. Pat. App. No. 61/222,628 filed Jul. 2, 2009, entitled Methods of Using A Silicon Particle Fluid To Control In Situ A Set Of Dopant Diffusion Profiles, and is a Continuation-In-Part of U.S. patent application Ser. No. 12/692,878, filed Jan. 25, 2010, entitled Methods Of Forming A Dual-Doped Emitter On A Substrate With An Inline Diffusion Apparatus, the entire disclosures of which are incorporated by reference.

FIELD OF DISCLOSURE

This disclosure relates in general to p-n junctions and in particular to methods of forming a multi-doped junction with silicon-containing particles.

BACKGROUND

A solar cell converts solar energy directly to DC electric energy. Generally configured as a photodiode, a solar cell permits light to penetrate into the vicinity of metal contacts such that a generated charge carrier (electrons or holes (a lack of electrons)) may be extracted as current. And like most other diodes, photodiodes are formed by combining p-type and n-type semiconductors to form a junction.

Electrons on the p-type side of the junction within the electric field (or built-in potential) may then be attracted to the n-type region (usually doped with phosphorous) and repelled from the p-type region (usually doped with boron), whereas holes within the electric field on the n-type side of the junction may then be attracted to the p-type region and repelled from the n-type region. Generally, the n-type region and/or the p-type region can each respectively be comprised of varying levels of relative dopant concentration, often shown as n−, n+, n++, p−, p+, p++, etc. The built-in potential and thus magnitude of electric field generally depend on the level of doping between two adjacent layers.

Substantially affecting solar cell performance, carrier lifetime (recombination lifetime) is defined as the average time it takes an excess minority carrier (non-dominant current carrier in a semiconductor region) to recombine and thus become unavailable to conduct an electrical current. Likewise, diffusion length is the average distance that a charge improves conductivity, it also tends to increase recombination. Consequently, the shorter the recombination lifetime or recombination length, the closer the metal region must be to where the charge carrier was generated.

Most solar cells are generally formed on a silicon substrate doped with a first dopant (commonly boron) forming an absorber region, upon which a second counter dopant (commonly phosphorous), is diffused forming the emitter region, in order to complete the p-n junction. After the addition of passivation and antireflection coatings, metal contacts (fingers and busbar on the emitter and pads on the back of the absorber) may be added in order to extract generated charge. Emitter dopant concentration, in particular, must be optimized for both carrier collection and for contact with the metal electrodes.

In general, a low concentration of (substitutional) dopant atoms within an emitter region will result in both low recombination (thus higher solar cell efficiencies), and poor electrical contact to metal electrodes. Conversely, a high concentration of (substitutional) dopant atoms will result in both high recombination (thus reducing solar cell efficiency), and low resistance ohmic contacts to metal electrodes. Often, in order to reduce manufacturing costs, a single dopant diffusion is generally used to form an emitter, with a doping concentration selected as a compromise between low recombination and low resistance ohmic contact. Consequently, potential solar cell efficiency (the percentage of sunlight that is converted to electricity) is limited.

One solution is the use of a dual-doped or selective-emitter. A selective emitter uses a first lightly doped region optimized for low recombination, and a second heavily doped region (of the same dopant type) optimized for low resistance ohmic metal contact. However, a selective-emitter configuration may be difficult to achieve in a one-step diffusion process and may involve several masking steps, consequently increasing manufacturing costs. In addition, since there are generally no visual boundaries between high doped and low doped emitter regions, the alignment of a metal contact onto a previously deposited highly doped region may be difficult.

In view of the foregoing, there is a desire to provide methods of in situ control of a phosphorous profile with silicon-containing particles.

SUMMARY

The invention relates, in one embodiment, to a method of forming a multi-doped junction on a substrate is disclosed. The method includes providing the substrate doped with boron atoms, the substrate comprising a front substrate surface. The method further includes depositing an ink on the front substrate surface in an ink pattern, the ink comprising a set of silicon-containing particles and a set of solvents. The method also includes heating the substrate in a baking ambient to a first temperature and for a first time period in order to create a densified film ink pattern. The method further includes exposing the substrate to a dopant source in a diffusion furnace with a deposition ambient, the deposition ambient comprising $POCl_3$, a carrier $N_2$ gas, a main $N_2$ gas, and a reactive $O_2$ gas at a second temperature and for a second time period, wherein a PSG layer is formed on the front substrate surface and on the densified film ink pattern; and heating the substrate in a drive-in ambient to a third temperature and a third time period; wherein a first diffused region with a first sheet resistance is formed under the front substrate surface covered by the densified film ink pattern, and a second diffused region with a second sheet resistance is formed under the front substrate surface not covered with the densified film ink pattern, and wherein the first sheet resistance is substantially smaller than the second sheet resistance.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
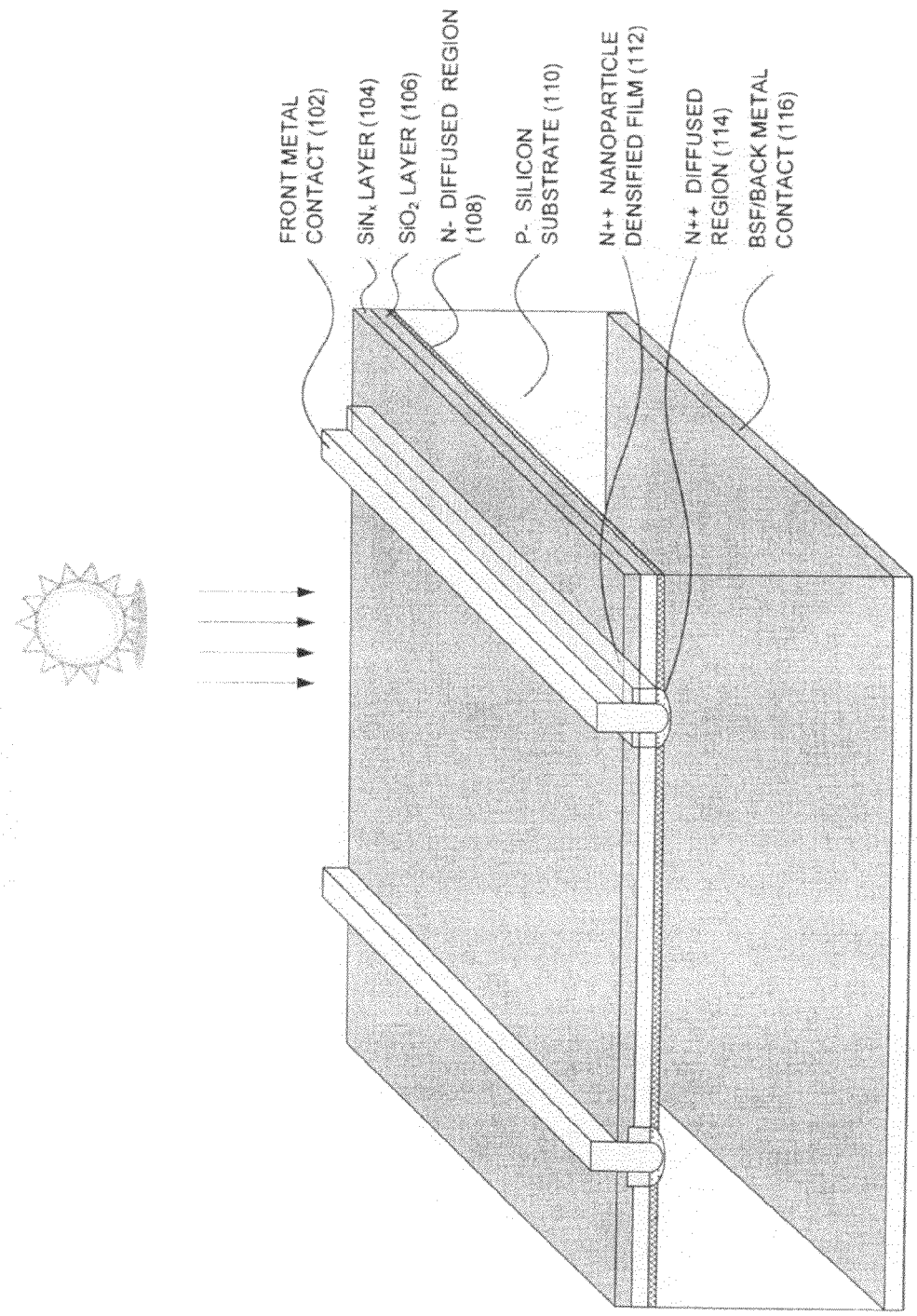
FIG. 1 shows a simplified diagram of a solar cell with a selective emitter.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously described, forming multi-doped junctions on a substrate, such as for a solar cell, tends to be problematic since multiple separate diffusions and patterning steps are often required, consequently increasing manufacturing costs. In an advantageous manner, a silicon substrate may be processed, such that a set of heavily doped regions (under deposited silicon-containing particles) and a set of lightly doped regions (under non-deposited areas) may both be formed in a dopant diffusion ambient.

For example, in order to form a multi-doped junction, such as a selective emitter, a combination of gases and a masking step are often used to deposit dopants on a Group IV substrate. That is, a mask is first deposited and the substrate is then exposed to a first dopant gas to form the highly doped regions. The mask is then removed, and the Group IV substrate is then exposed to a second lower concentration dopant gas, thus creating a selective emitter configuration.

In order to diffuse phosphorous into a boron doped silicon substrate in a quartz tube furnace, $POCl_3$ (phosphorus oxychloride) is used. The reaction is typically:

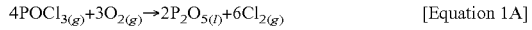
[Equation 1A]

[Equation 1B]

[Equation 2]

The typical gases involved in a $POCl_3$ diffusion process include: an ambient nitrogen gas (main $N_2$ gas), a carrier nitrogen gas (carrier $N_2$ gas) which is flowed through a bubbler filled with liquid $POCl_3$, a reactive oxygen gas (reactive $O_2$ gas) configured to react with the vaporized $POCl_3$ to form the deposition (processing) gas, and optionally a main oxygen gas (main $O_2$ gas) configured to later form an oxide layer.

In general, a silicon substrate is first placed in a heated tube furnace with a nitrogen gas ambient (main $N_2$ gas). The deposition gas ($POCl_3$ vapor) is then flowed into the tube furnace, heated to a deposition temperature, and exposed to reactive $O_2$ (oxygen) gas to form $P_2O_5$ (phosphorus pentoxide) on the silicon substrate, as well as $Cl_2$ (chlorine) gas that interacts with and removes metal impurities in the silicon substrate. $P_2O_5$ in turn reacts with the silicon substrate to form $SiO_2$, and free P atoms. The simultaneous oxidation of the silicon wafer during the deposition results in the formation of a $SiO_2.P_2O_5$ layer (PSG or phosphosilicate glass).

An additional drive-in step (free of any $POCl_3$ flow) is typically employed using the deposition temperature or a higher temperature in order to enable the free phosphorous atoms to diffuse further into the silicon substrate and substitutionally replace silicon atoms in the lattice in order to be available for charge carrier generation. During this step, ambient gas which may comprise of main $N_2$ gas and/or main $O_2$ gas is flowed into the tube furnace. The use of oxygen would result in the formation of an oxide layer at the silicon wafer surface. Such an oxide layer attenuates the diffusion of P atoms from the PSG layer into the silicon substrate allowing for more control over the resultant diffusion profiles. In general, for a given temperature phosphorous diffuses slower in $SiO_2$ than in silicon.

In contrast, another approach to phosphorus doping of silicon wafers is a spray-on technique whereby a phosphoric acid ($H_3PO_4$) mixture (usually mixed with water or an alcohol like ethanol or methanol) is sprayed onto the wafer and then subjected to a thermal treatment.

The diffusion of phosphorus into a silicon wafer using phosphoric acid as a dopant source occurs via the following reaction:

[Equation 3A]

[Equation 3B]

The first step involves the dehydration of phosphoric acid which produces phosphorus pentoxide ($P_2O_5$) on the silicon surface which in turn acts as the phosphorus source. $P_2O_5$ in turn reacts with the silicon substrate to form $SiO_2$, and free P atoms. An example of this process is further disclosed in U.S. patent application Ser. No. 12/692,878, filed Jan. 25, 2010, the entire disclosure of which is incorporated by reference.

Likewise, boron may be deposited on a phosphorus doped silicon substrate using $BBr_3$ (boron tri-bromide). The reaction is typically:

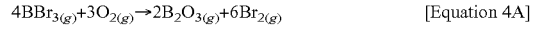
[Equation 4A]

[Equation 4B]

[Equation 2]

In general, a silicon substrate is first placed in a heated tube furnace which has a nitrogen gas (main $N_2$ gas), a carrier nitrogen gas (carrier $N_2$) which is flowed through a bubbler filled with liquid $BBr_3$, a reactive oxygen gas (reactive $O_2$ gas) configured to react with the vaporized $BBr_3$ to form $B_2O_3$ (boric oxide) on the silicon substrate, and optionally a main oxygen gas (main $O_2$ gas) configured to later form an oxide layer.

$B_2O_3$ in turn reacts with the silicon substrate to form $SiO_2$, and free boron atoms. The simultaneous oxidation of the silicon wafer during the deposition results in the formation of a $SiO_2.B_2O_3$ layer (BSG or boro-silicate glass)

An additional drive-in step (free of any $BBr_3$ flow) is typically employed using the deposition temperature or a higher temperature in order to enable the free boron atoms to diffuse further into the silicon substrate and substitutionally replace silicon atoms in the lattice in order to be available for charge carrier generation. During this step, ambient gas which may comprise of nitrogen (main $N_2$) and/or oxygen (main $O_2$) is flowed into the tube furnace. The use of oxygen would result in the formation of an oxide layer at the silicon wafer surface. Such an oxide layer attenuates the diffusion of boron atoms from the $B_2O_3$ layer into the silicon substrate allowing for more control over the resultant diffusion profiles. In general, for a given temperature boron diffuses slower in $SiO_2$ than in silicon. In some cases a pre-deposition oxide layer may be grown onto the silicon wafer to allow for better diffusion uniformity.

In the case of a selective emitter, a lightly doped region with sheet resistance of between about 70 Ohm/sq to about 140 Ohm/sq is optimal, while a heavily doped region (of the same dopant type) with a sheet resistance of between about 20 Ohm/sq to about 70 Ohm/sq is optimal.

While not wishing to be bound by theory, the inventors believe that the substantially larger silicon surface areas of the deposited silicon-particle-containing films (in comparison to the relative smaller surface area of the underlying substrate) allow a larger volume of surface PSG (or BSG in the case of a boron dopant source) to be formed, which in turn, allows for a larger amount of phosphorus to be driven into the underlying wafer.

That is, in the case of a phosphorous dopant, the larger silicon surface area allows for greater reduction of phosphorus from $P_2O_5$ (via the reaction described in Equation 1A-B or 3A-B above), than on the silicon substrate surface. Phosphorus may then diffuse into the underlying silicon substrate via the silicon cluster channels formed in the silicon-particle-containing film via partial sintering of the silicon-containing particles. In addition, since silicon atoms are needed for the reaction, films composed of non-silicon-containing particles will only allow a larger volume of un-reacted $P_2O_5$ to be formed resulting in attenuated drive-in of phosphorus into the underlying wafer.

Likewise, in the case of a boron dopant, the larger silicon surface area allows for greater reduction of boron from $B_2O_3$ (via the reaction described in Equation 4A-B above), than on the silicon substrate surface. Boron may then diffuse into the underlying silicon substrate via the silicon cluster channels formed in the silicon-particle-containing film via partial sintering of the silicon-containing particles.

Figure 7:
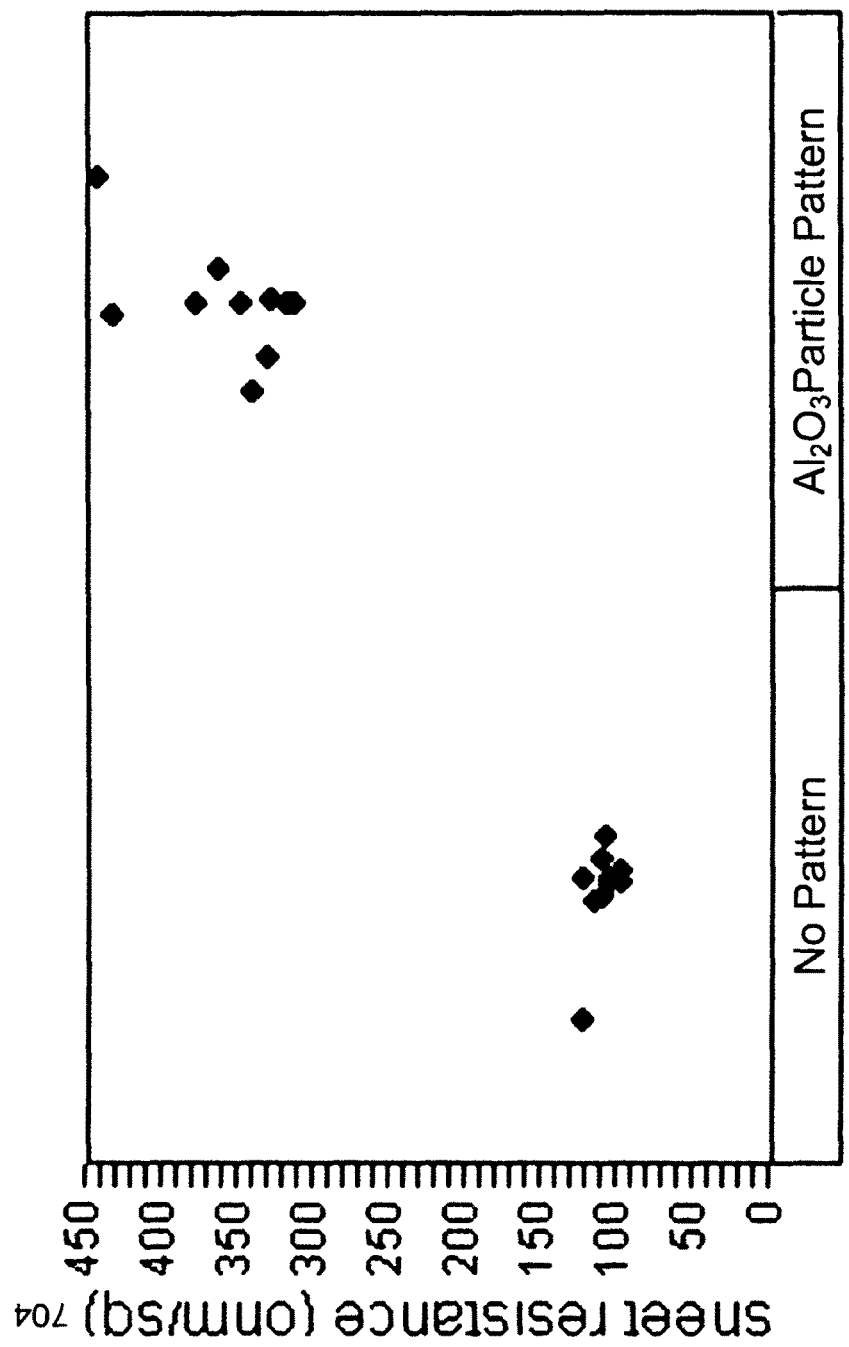
FIG. 7 shows the sheet resistance for two sets of silicon substrates, a first subset covered with deposited $Al_2O_3$ particles and a second set without deposited $Al_2O_3$ particles.
Figure 8A:
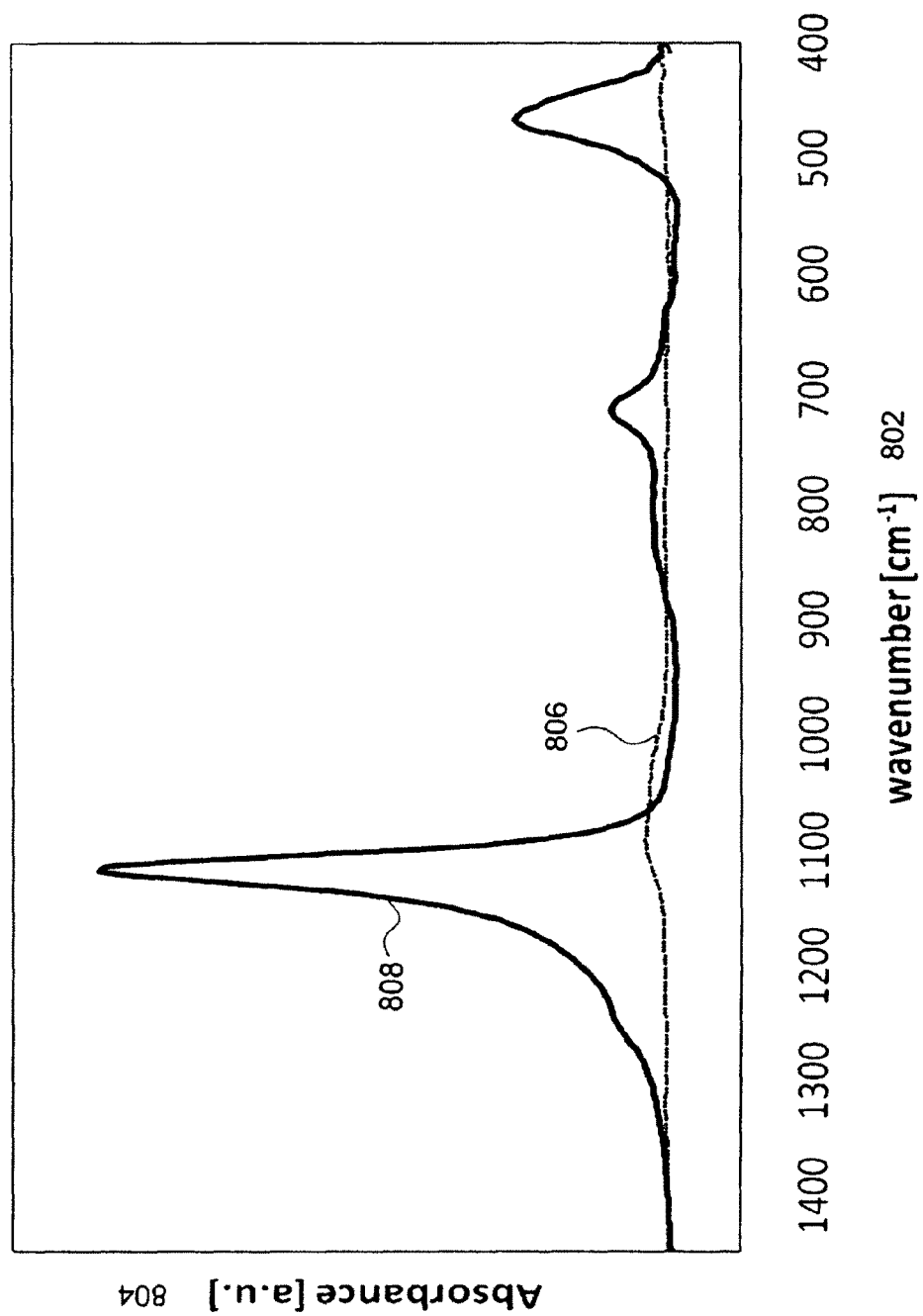
FIGS. 8A-B show a set of FTIR diagrams for a silicon substrate processed with $Al_2O_3$ particles; and, FIG. 9 shows the sheet resistance for two sets of silicon substrates, a first subset covered with deposited $ZrO_2$ particles and a second set without deposited $ZrO_2$.
Figure 8B:
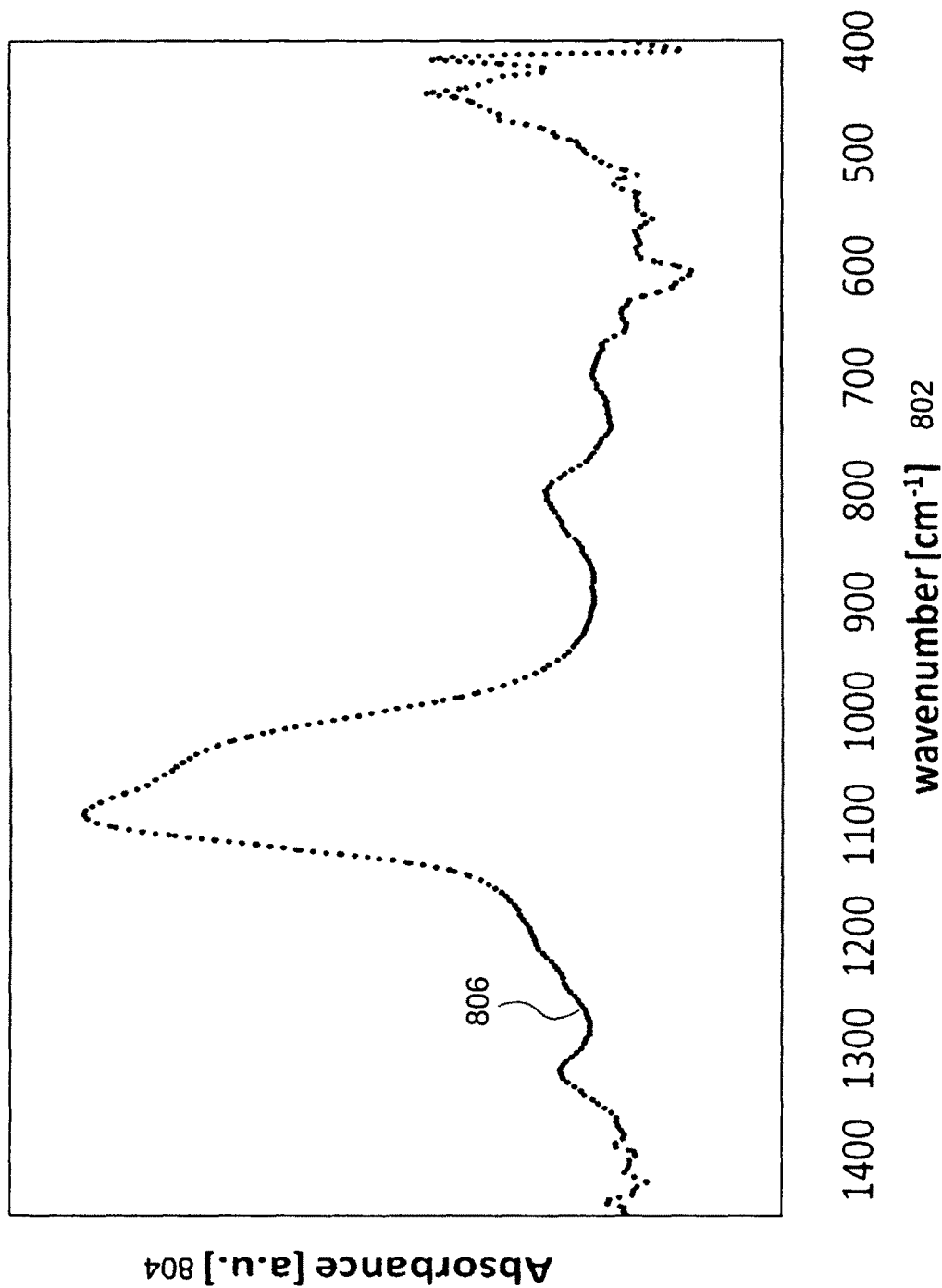
Figure 9:
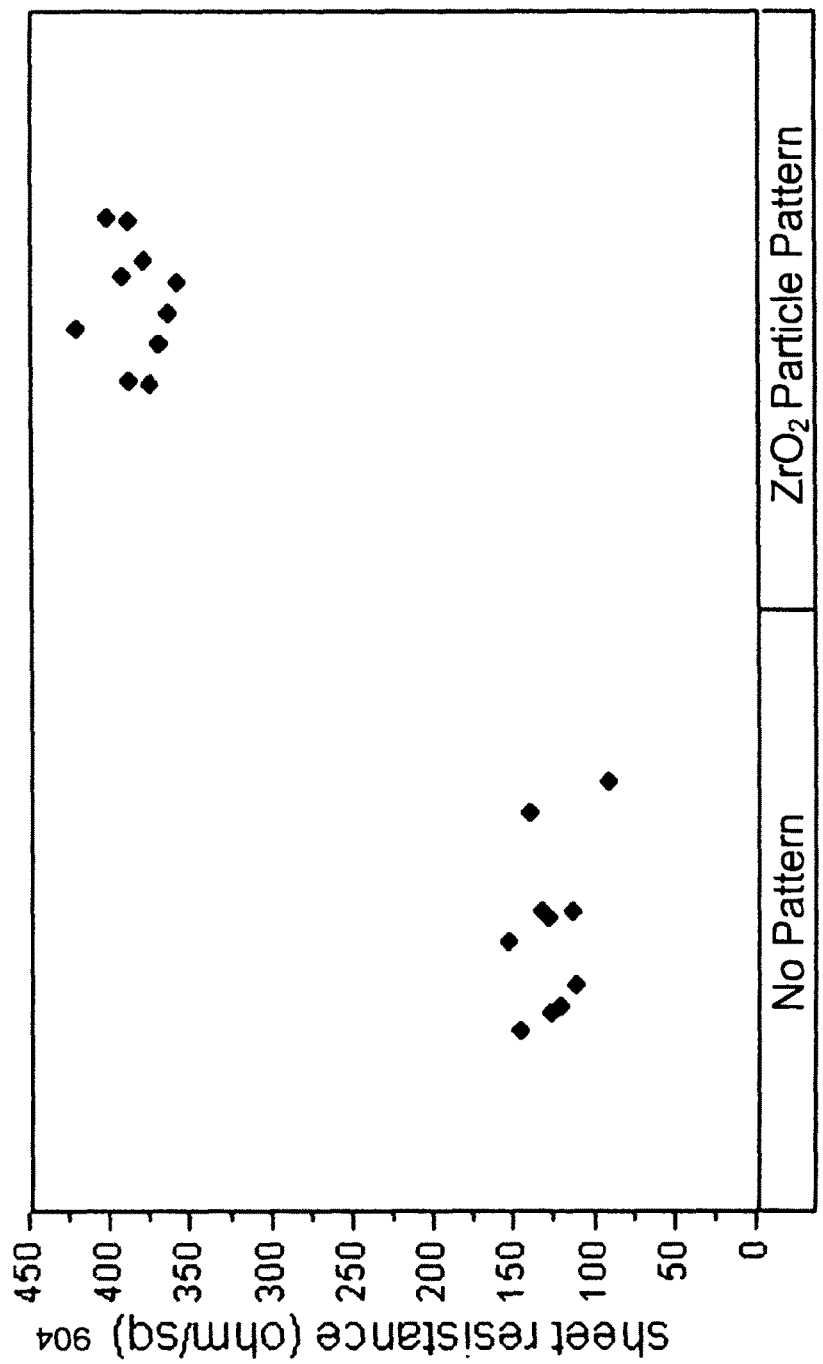

Consequently, FIGS. 2-5 will describe the effect of films composed of silicon-containing particles (Si, $SiO_x$, and $Si_xN_y$, respectively), while FIGS. 7-9 will describe the effect of films composed of non-silicon-containing particles ($Al_2O_3$ and $ZrO_2$ respectively).

One method of depositing the layer of silicon-containing particles onto the silicon substrate surface is the deposition through the use of a fluid, such as a colloidal dispersion or ink. Generally, colloidal dispersions of Group IV particles are possible because the interaction of the particle surface with the solvent is strong enough to overcome differences in density, which usually result in a material either sinking or floating in a liquid. That is, smaller particles disperse more easily than larger particles.

Examples of solvents include alcohols, aldehydes, ketones, carboxylic acids, esters, amines, organosiloxanes, halogenated hydrocarbons, and other hydrocarbon solvents. In addition, the solvents may be mixed in order to optimize physical characteristics such as viscosity, density, polarity, etc.

In addition, in order to better disperse the silicon-containing particles in the colloidal dispersion, particle capping groups may be formed with the addition of organic compounds, such as alcohols, aldehydes, ketones, carboxylic acids, esters, and amines, as well as organosiloxanes. Alternatively, capping groups may be added in-situ by the addition of gases into the plasma chamber. These capping groups may be subsequently removed during the sintering process, or in a lower temperature pre-heat just before the sintering process.

For example, bulky capping agents suitable for use in the preparation of capped Group IV semiconductor particles include C4-C8 branched alcohols, cyclic alcohols, aldehydes, and ketones, such as tertiary-butanol, isobutanol, cyclohexanol, methyl-cyclohexanol, butanal, isobutanal, cyclohexanone, and oraganosiloxanes, such as methoxy(tris(trimethylsilyl)silane) (MTTMSS), tris(trimethylsilyl)silane (TTMSS), decamethyltetrasiloxane (DMTS), and trimethylmethoxysilane (TMOS).

Once formulated, the colloidal dispersion may be applied to a substrate and subjected to a heat treatment in order to sinter the silicon-containing particles into a densified conductive film. Examples of application methods include, but are not limited to, roll coating, slot die coating, gravure printing, flexographic drum printing, and inkjet printing methods, etc.

Referring now to FIG. 1, a simplified diagram of a solar cell with a selective emitter. In a common configuration, an n++ diffused region 114 and n− diffused region 108 are first formed on a p− (lightly doped) silicon substrate 110. $SiO_2$ layer 106 is then formed on a p− (lightly doped) silicon substrate 110 in order to help passivate the front surface of silicon substrate 110.

A $SiN_x$ 104 layer is then formed on the front surface of $SiO_2$ layer 106. Like $SiO_2$ layer 106, $SiN_x$ layer 104 helps passivate the surface of silicon substrate 110, minimizing both contamination of the wafer bulk from external sources, as well as reducing minority carrier recombination at the surface of silicon substrate 110. Additionally, $SiN_x$ 104 layer may be optimized to reduce the reflectivity of the front surface of the solar cell, substantially improving efficiency and thus performance.

Front-metal contact 102 and back surface field (BSF)/back metal contact 116 are then generally formed on silicon substrate 110. Front-metal contact 102 is generally formed from an Ag paste comprising Ag powder (70 to 80 wt %), lead borosilicate glass PbO—$B_2O_3$—$SiO_2$ (1 to 10 wt %), and organic components (15 to 30 wt %). BSF/back metal contact 116 is generally formed from aluminum, and is configured to create an electrical field that repels and thus minimize the impact of minority carrier rear surface recombination. In addition, Ag pads [not shown] are generally applied onto BSF/back metal contract 116 in order to facilitate soldering for interconnection into modules.

SILICON-CONTAINING PARTICLES

Experiment 1

Figure 2:
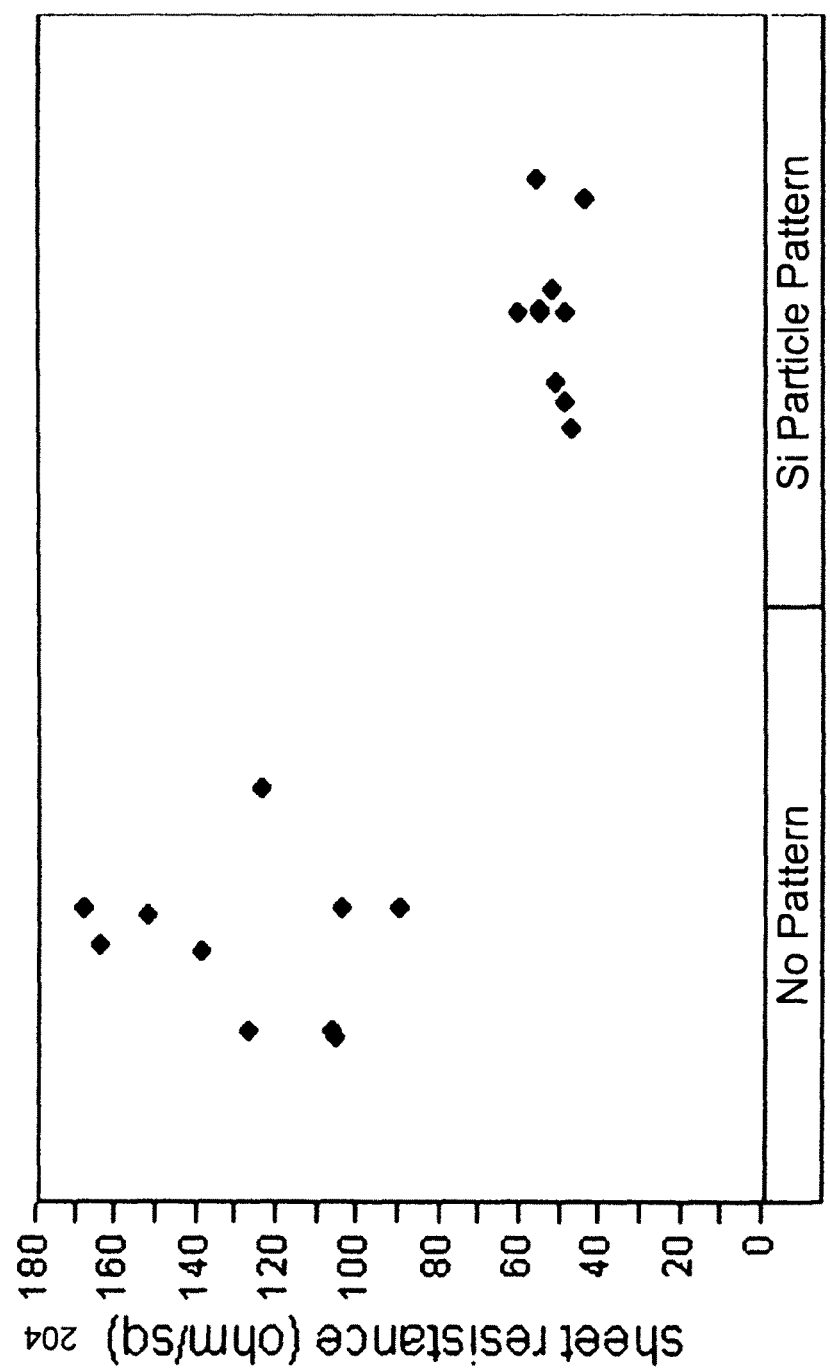
FIG. 2 shows the sheet resistance for two sets of silicon substrates, a first subset covered with deposited Si particles and a second set without deposited Si particles, in accordance with the invention.

Referring now to FIG. 2, the sheet resistance was measured for two sets of silicon substrates, a first subset covered with deposited Si particles (patterned) and a second set without deposited Si particles (non-patterned), in accordance with the invention. Sheet resistance in ohm/sq is shown along the vertical axis 204. All substrates were p-type saw-damage etched, had a thickness of about 180 um and a resistivity of about 2 Ohm-cm.

The substrates were first cleaned with piranha (a mixture of sulfuric acid ($H_2SO_4$) and hydrogen peroxide ($H_2O_2$)). This cleaning was followed by a DI water rinsing step and then a buffered oxide etch (BOE) dip, followed by a final DI water rinse. Substrates were then dried using $N_2$ prior to the deposition of a set of Si particles in organic solvents on one side of the substrate.

Substrates were then subjected to baking at a temperature of 125° C. in a baking ambient for a baking time period of about 5 minutes in order to evaporate solvent molecules and to densify the film. Consequently, the inventors believe the baking time period may be between about 10 seconds and about 20 minutes. The inventors further believe that a baking temperature of between about 100° C. and about 600° C. is preferable, a baking temperature of between about 300° C. and about 500° C. is more preferable, and a baking temperature of about 400° C. is most preferable.

The substrates were then exposed to a dopant source in a diffusion furnace with an atmosphere of $POCl_3$, $N_2$, and $O_2$. All the substrates had an initial deposition temperature of about 800° C. for 20 minutes. The inventors believe the initial deposition temperature may preferably be between about 725° C. and about 850° C., more preferably between about 750° C. and about 825° C., and most preferably about 800° C. The initial deposition time period may preferably be between about 10 minutes and about 35 minutes, more preferably between about 15 minutes and about 30 minutes, and most preferably about 20 minutes. Furthermore, a nitrogen (carrier $N_2$ gas) to oxygen (reactive $O_2$ gas) ratio during deposition of 1:1 was employed. The inventors believe that carrier $N_2$ gas to reactive $O_2$ ratios of between 1:1 and 1.5:1 during the deposition step to be preferable.

The initial deposition was followed by a drive-in step with drive-in temperature of about 900° C. for about 25 minutes in an $N_2$ ambient. The residual PSG glass layers on the substrate surface and the densified film surface were subsequently removed by a BOE cleaning step for about 5 minutes. The process resulted in an average pattern region sheet resistance of 52.1 ohm/sq and an average non-pattern region sheet resistance of 128.2 ohm/sq. Consequently, the differential dopant profile between heavily doped and lightly doped regions (as reflected in sheet resistance) is beneficial for the formation of a selective emitter as previously described.

The inventors believe the drive-in temperature may be preferably between about 850° C. and about 1050° C., more preferably between about 860° C. and about 950° C., and most preferably about 875° C. The drive-in time period may be preferably between about 10 minutes and about 60 minutes, more preferably between about 15 minutes and about 30 minutes, and most preferably about 25 minutes.

Experiment 2

Figure 3:
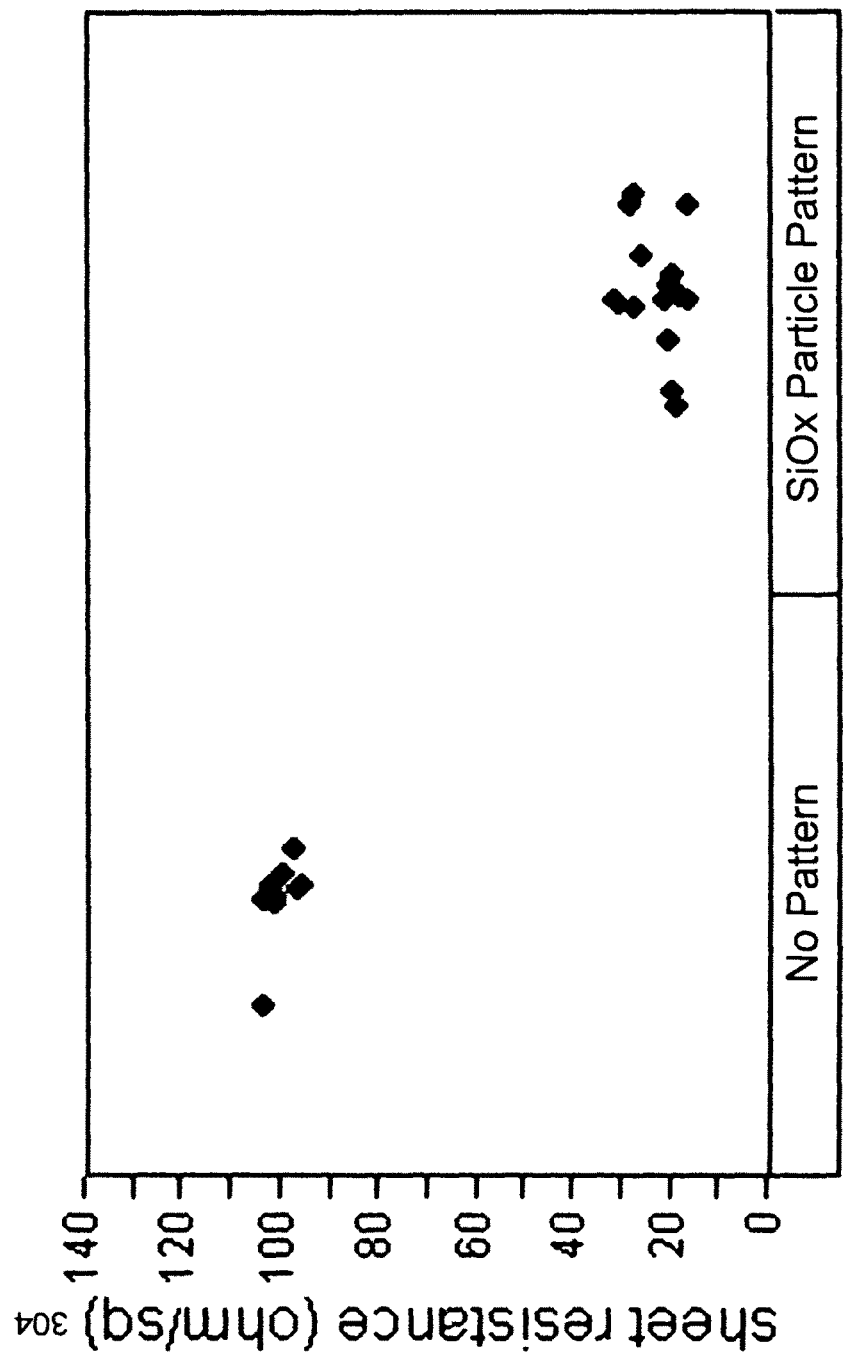
FIG. 3 shows the sheet resistance for two sets of silicon substrates, a first subset covered with deposited $SiO_x$ particles and a second set without deposited $SiO_x$ particles, in accordance with the invention.

Referring now to FIG. 3, the sheet resistance was measured for two sets of silicon substrates, a first subset covered with deposited $SiO_x$ particles (such as $SiO_2$) (patterned) and a second set without deposited $SiO_x$ particles (non-patterned), where x is a positive integer, in accordance with the invention. Sheet resistance in ohm/sq is shown along the vertical axis 304. All substrates were p-type saw-damage etched, had a thickness of about 180 um and a resistivity of about 2 Ohm-cm.

The substrates were first cleaned with piranha (a mixture of sulfuric acid ($H_2SO_4$) and hydrogen peroxide ($H_2O_2$)). This cleaning was followed by a DI water rinsing step and then a subsequent buffered oxide etch (BOE) dip, followed by a final DI water rinse. Substrates were then dried using $N_2$ prior to the deposition of a set of $SiO_x$ particles in organic solvents on one side of the substrate.

Substrates were then subjected to baking at a temperature of 125° C. in a baking ambient for a baking time period of about 5 minutes in order to evaporate solvent molecules and to densify the film. Consequently, the inventors believe the baking time period may be between about 10 seconds and about 20 minutes. The inventors further believe that a baking temperature of between about 100° C. and about 600° C. is preferable, a baking temperature of between about 300° C. and about 500° C. is more preferable, and a baking temperature of about 400° C. is most preferable.

The substrates were then exposed to a dopant source in a diffusion furnace with an atmosphere of $POCl_3$, $N_2$, and $O_2$. All the substrates had an initial deposition temperature of about 800° C. for 20 minutes. The inventors believe the initial deposition temperature may be preferably between about 725° C. and about 850° C., more preferably between about 750° C. and about 825° C., and most preferably about 800° C. The initial deposition time period may be preferably between about 10 minutes and about 35 minutes, more preferably between about 15 minutes and about 30 minutes, and most preferably about 20 minutes. Furthermore, a nitrogen (carrier $N_2$ gas) to oxygen (reactive $O_2$ gas) ratio during deposition of 1:1 was employed. The inventors believe that carrier $N_2$ gas to reactive $O_2$ ratios of between 1:1 and 1.5:1 during the deposition step to be preferable.

The initial deposition was followed by a drive-in step with drive-in temperature of about 900° C. for about 25 minutes in an $N_2$ ambient. The residual PSG glass layers on the substrate surface and the densified film surface were subsequently removed by a BOE cleaning step for about 5 minutes. The process resulted in an average pattern region sheet resistance of 22.9 ohm/sq and an average non-pattern region sheet resistance of 100.6 ohm/sq. Consequently, the differential dopant profile between heavily doped and lightly doped regions (as reflected in sheet resistance) is beneficial for the formation of a selective emitter as previously described.

The inventors believe the drive-in temperature may be preferably between about 850° C. and about 1050° C., more preferably between about 860° C. and about 950° C., and most preferably about 875° C. The drive-in time period may be preferably between about 10 minutes and about 60 minutes, more preferably between about 15 minutes and about 30 minutes, and most preferably about 25 minutes.

Experiment 3

Figure 4:
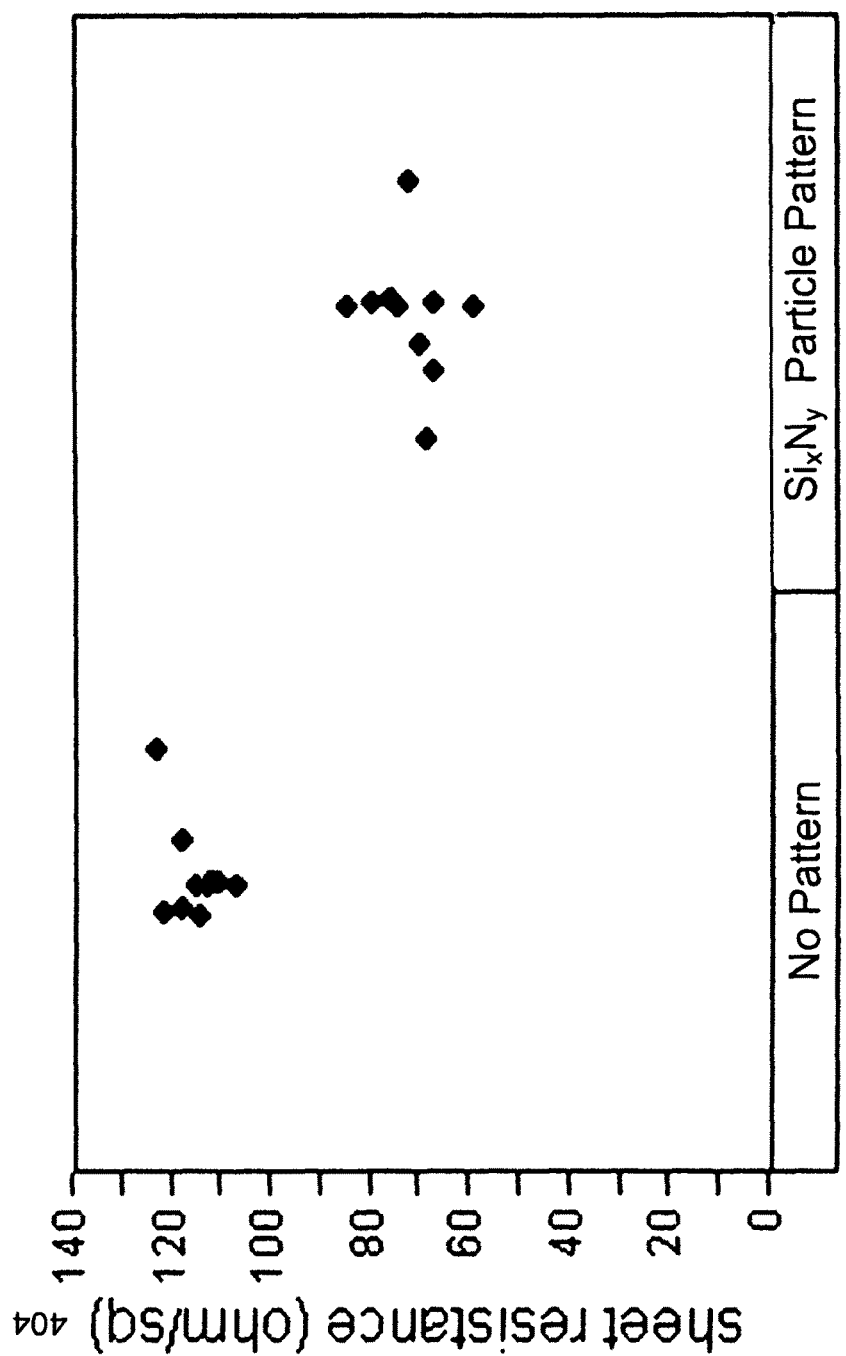
FIG. 4 shows the sheet resistance for two sets of silicon substrates, a first subset covered with deposited $Si_xN_y$ particles and a second set without deposited $Si_xN_y$, in accordance with the invention.

Referring now to FIG. 4, the sheet resistance was measured for two sets of silicon substrates, a first subset covered with deposited $Si_xN_Y$ particles (such as $Si_3N_4$) (patterned) and a second set without deposited $Si_xN_Y$ particles (non-patterned), where x and y are positive integers, in accordance with the invention. Sheet resistance in ohm/sq is shown along the vertical axis 404. All substrates were p-type saw-damage etched, had a thickness of about 180 um and a resistivity of about 2 Ohm-cm.

The substrates were first cleaned with piranha (a mixture of sulfuric acid ($H_2SO_4$) and hydrogen peroxide ($H_2O_2$)). This cleaning was followed by a DI water rinsing step and then a subsequent buffered oxide etch (BOE) dip, followed by a final DI water rinse. Substrates were then dried using $N_2$ prior to the deposition of a set of $Si_xN_y$ particles in organic solvents on one side of the substrate.

Substrates were then subjected to baking at a temperature of 125° C. in a baking ambient for a baking time period of about 5 minutes in order to evaporate solvent molecules and to densify the film. Consequently, the inventors believe the baking time period may be between about 10 seconds and about 20 minutes. The inventors further believe that a baking temperature of between about 100° C. and about 600° C. is preferable, a baking temperature of between about 300° C. and about 500° C. is more preferable, and a baking temperature of about 400° C. is most preferable.

The substrates were then exposed to a dopant source in a diffusion furnace with an atmosphere of $POCl_3$, $N_2$, and $O_2$. All the substrates had an initial deposition temperature of about 800° C. for 20 minutes. The inventors believe the initial deposition temperature may preferably be between about 725° C. and about 850° C., more preferably between about 750° C. and about 825° C., and most preferably about 800° C. The initial deposition time period may preferably be between about 10 minutes and about 35 minutes, more preferably between about 15 minutes and about 30 minutes, and most preferably about 20 minutes. Furthermore, a nitrogen (carrier $N_2$ gas) to oxygen (reactive $O_2$ gas) ratio during deposition of 1:1 was employed. The inventors believe that carrier $N_2$ gas to reactive $O_2$ ratios of between 1:1 and 1.5:1 during the deposition step to be preferable.

The initial deposition was followed by a drive-in step with drive-in temperature of about 900° C. for about 25 minutes in an $N_2$ ambient. The residual PSG glass layers on the substrate surface and the densified film surface were subsequently removed by a BOE cleaning step for about 5 minutes.

The process resulted in an average pattern region sheet resistance of 72.2 ohm/sq and an average non-pattern region sheet resistance of 115.5 ohm/sq. Consequently, the differential dopant profile between heavily doped and lightly doped regions (as reflected in sheet resistance) is beneficial for the formation of a selective emitter as previously described.

The inventors believe the drive-in temperature may be preferably between about 850° C. and about 1050° C., more preferably between about 860° C. and about 950° C., and most preferably about 875° C. The drive-in time period may be preferably between about 10 minutes and about 60 minutes, more preferably between about 15 minutes and about 30 minutes, and most preferably about 25 minutes.

Experiment 4

Figure 5:
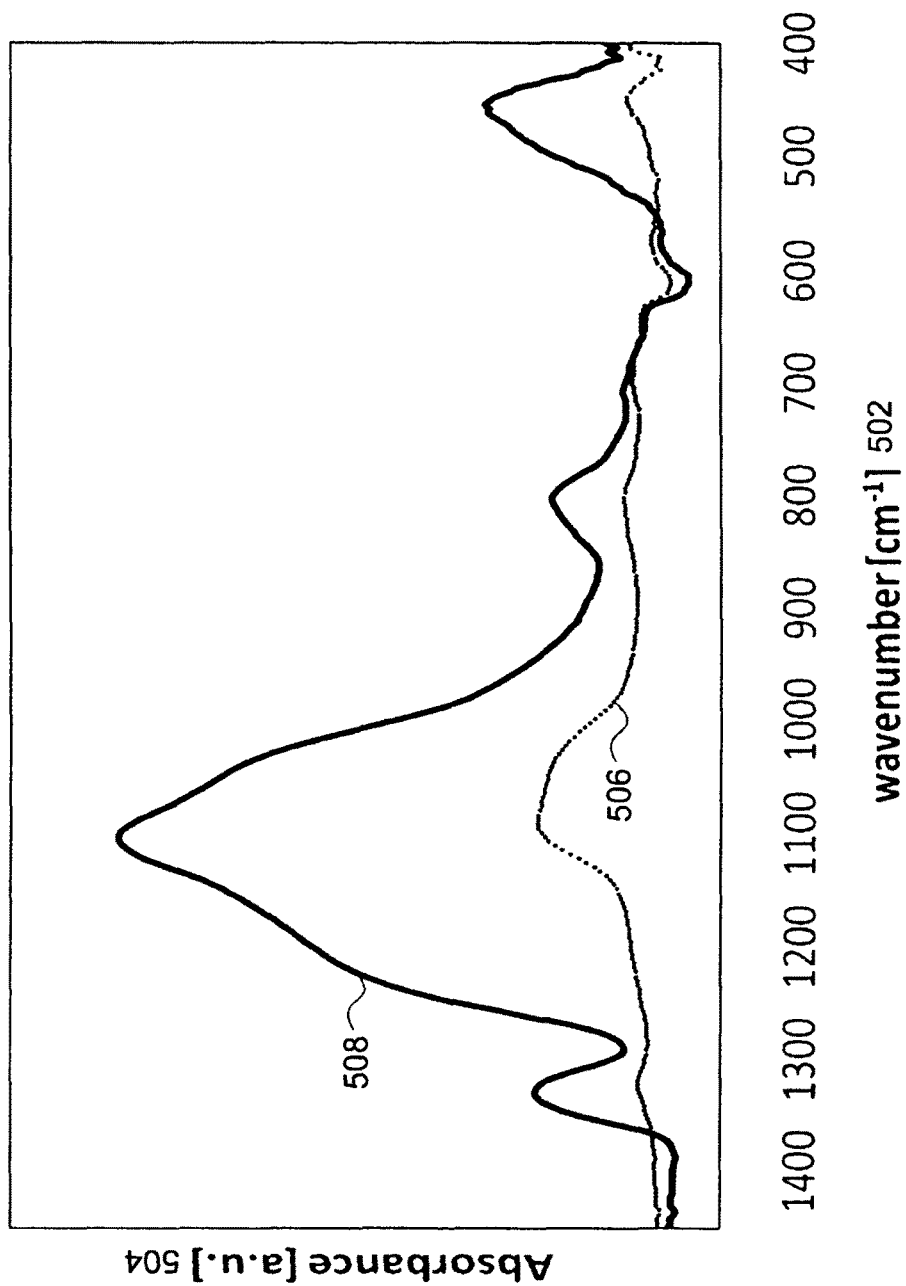
FIG. 5 shows a set of FTIR diagrams for two silicon substrates, a first subset covered with deposited Si particles and a second set without deposited Si particles, in accordance with the invention.

Referring now to FIG. 5, an FTIR was measured for two silicon substrates, a first subset covered with deposited Si particles (patterned) and a second set without deposited Si particles (non-patterned), where x and y are positive integers, in accordance with the invention. The inventors have achieved substantially similar results using other silicon-containing particles, notably $SiO_x$ particles (as shown in FIG. 3), and $Si_xN_y$ particles (as shown in FIG. 4). The first spectrum 506 shows the absorbance of the substrate without deposited ink, while the second spectrum 508 shows the absorbance of the substrate with deposited ink.

In general, FTIR (Fourier transform spectroscopy) is a measurement technique whereby spectra are collected based on measurements of the temporal coherence of a radiative source, using time-domain measurements of the electromagnetic radiation or other type of radiation 502 (shown as wave number on the horizontal axis). At certain resonant frequencies characteristic of the chemical bonding within a specific sample, the radiation 502 will be absorbed (shown as absorbance A.U. on the vertical axis) resulting in a series of peaks in the spectrum, which can then be used to identify the chemical bonding within samples. The radiation absorption is proportional the number of bonds absorbing at a given frequency.

Here, two polished mono-crystalline silicon substrates, a first substrate covered with deposited Si particles (patterned) and a second substrate without deposited Si particles (non-patterned), in accordance with the invention. The ink covered substrate was heated to about 125° C. for about 5 minutes in order to bake off solvents in the fluid. The substrates were loaded into a standard tube furnace and subjected to a $POCl_3$ deposition step at about 800° C. for about 20 minutes, using a nitrogen (carrier $N_2$) to oxygen (reactive $O_2$) gas ratio of about 1:1 during deposition. No subsequent drive-in step was performed. The process was thus terminated after $P_2O_5$ deposition onto both the crystalline silicon substrate with ad without deposited silicon particles.

First spectrum 506 and second spectrum 508 show peaks in the range of 1330 $cm^{-1}$ that is characteristic of P=O (phosphorous oxygen double bonding) and around 450 $cm^{-1}$, 800 $cm^{-1}$, and 1100 $cm^{-1}$ that are characteristic of Si—O (silicon oxygen single bonding), all typical of deposited PSG films. The absorbance of the second (ink) spectrum 508 is substantially greater than the absorbance of the first (non-ink) spectrum 504, indicating that there is significantly more PSG embedded in the ink areas than on the non-ink areas. The evidence of significantly more PSG embedded in the ink areas as compared to the non ink areas is consistent with the larger silicon surface area provided by the silicon-particle-containing ink layer for PSG deposition compared with the silicon substrate surface.

While not wishing to be bound by theory, the inventors believe that the substantially larger surface areas of deposited silicon-containing particles (in comparison to the relative smaller surface area of the underlying substrate) allow a larger volume of surface PSG to be formed, which in turn, allows for a larger amount of phosphorus to be driven in. Consequently, the corresponding substrate beneath the deposited silicon-containing particles is exposed to a pseudo-unlimited dopant source compared to a limited dopant source in substrate areas not covered with particles.

Figure 6:
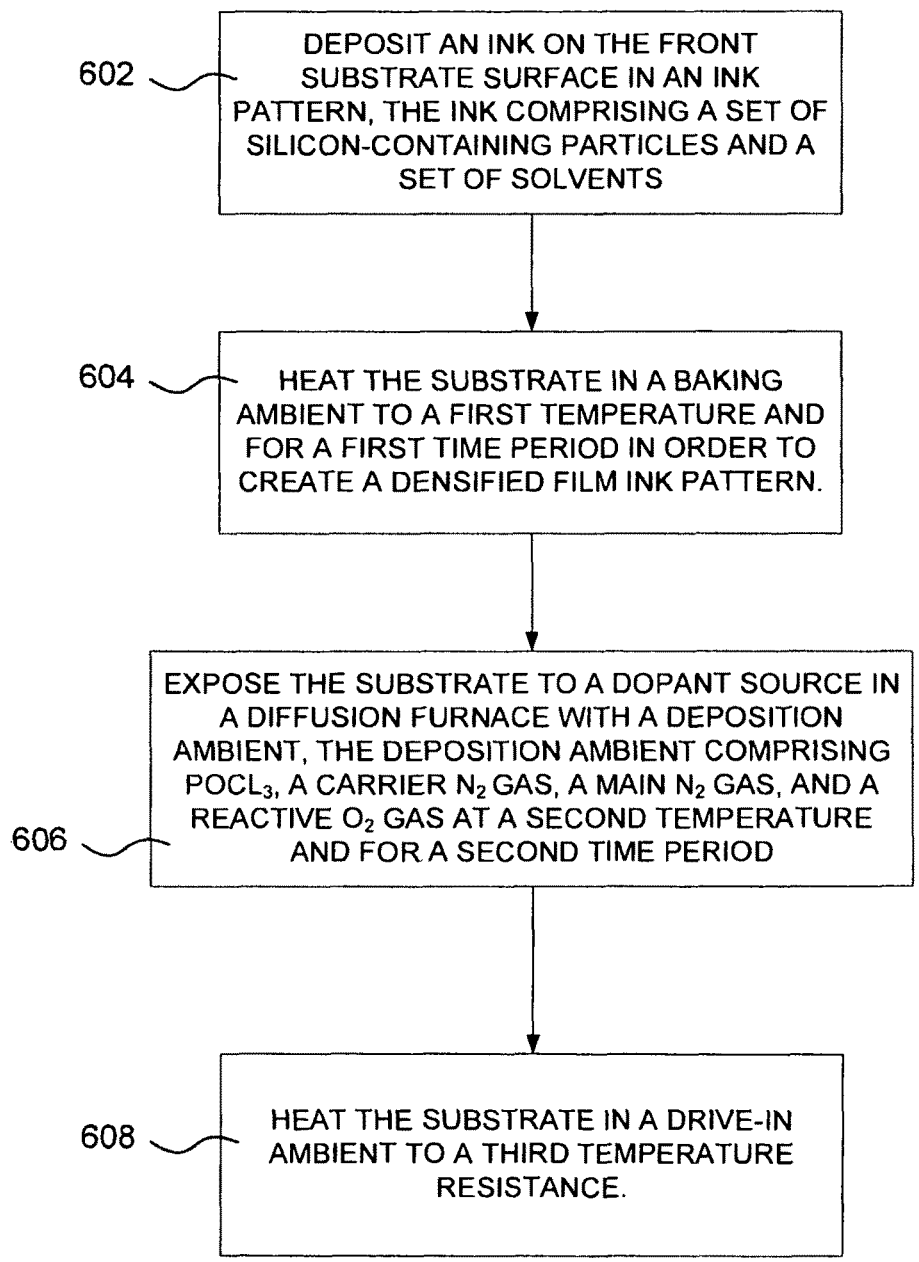
FIG. 6 shows a simplified method of forming a multi-doped junction on a substrate with silicon-containing particles, in accordance with the invention.

Referring now to FIG. 6, a simplified method of forming a multi-doped junction on a substrate with silicon-containing particles is shown, in accordance with the invention.

Initial, at 602, an ink is deposited on the front substrate surface in an ink pattern, the ink comprising a set of silicon-containing particles and a set of solvents.

Next at 604, the substrate is heated in a baking ambient to a first temperature and for a first time period in order to create a densified film ink pattern.

At 606, the substrate is exposed to a dopant source in a diffusion furnace with a deposition ambient, the deposition ambient comprising $POCl_3$, a carrier $N_2$ gas, a main $N_2$ gas, and a reactive $O_2$ gas at a second temperature and for a second time period.

And finally, at 608, the substrate is heated in a drive-in ambient to a third temperature and for a third time period.

NON-SILICON-CONTAINING PARTICLES

Experiment 5

Referring now to FIG. 7, the sheet resistance is compared for two sets of silicon substrates, a first subset covered with deposited $Al_2O_3$ particles (patterned) and a second set without deposited $Al_2O_3$ particles (non-patterned), in accordance with the invention. Sheet resistance in ohm/sq is shown along the vertical axis 704. All substrates were p-type saw-damage etched, had a thickness of about 180 um and a resistivity of about 2 Ohm-cm.

The substrates were first cleaned with piranha (a mixture of sulfuric acid ($H_2SO_4$) and hydrogen peroxide ($H_2O_2$)). This cleaning was followed by a DI water rinsing step and then a subsequent buffered oxide etch (BOE) dip, followed by a final DI water rinse. Substrates were then dried using $N_2$ prior to the deposition of a set of $Al_2O_3$ particles in organic solvents on one side of the substrate.

Substrates were then subjected to baking at a temperature of 125° C. in a baking ambient for a baking time period of about 5 minutes in order to and evaporate solvent molecules and to densify the film.

The substrates were then exposed to a dopant source in a diffusion furnace with an atmosphere of $POCl_3$, $N_2$, and $O_2$. All the substrates had an initial deposition temperature of about 800° C. for about 20 minutes.

The initial deposition was followed by a drive-in step with drive-in temperature of about 900° C. for about 25 minutes in an $N_2$ ambient. The residual PSG glass layers on the substrate surface and the densified film surface were subsequently removed by a BOE cleaning step for 5 minutes.

The process resulted in an average pattern region sheet resistance of 359.3 ohm/sq and an average non-pattern region sheet resistance of 109.4 ohm/sq. Consequently, the resulting differential dopant profile between heavily doped and lightly doped regions (as reflected in sheet resistance) is not suited for the formation of a selective emitter as previously described.

Experiment 6

Referring now to FIGS. 8A-B, a set of FTIR (Fourier Transform Infra-Red) diagrams are shown for a silicon substrate processed with $Al_2O_3$ particles. The inventors have achieved substantially similar results using other non-silicon-containing particles, notably $ZrO_2$ particles (as shown in FIG. 9). FIG. 8A shows the absorbance spectra of a substrate with deposited $Al_2O_3$ particles ($Al_2O_3$ absorbance spectra) 808, and of a substrate without deposited $Al_2O_3$ particles 806, while FIG. 8B shows the absorbance spectra for the substrate not deposited with $Al_2O_3$ particles 806 of FIG. 8A in greater detail.

Here, two polished mono-crystalline silicon substrates, a first substrate covered with deposited $Al_2O_3$ particles (patterned) and a second substrate without deposited $Al_2O_3$ particles (non-patterned), in accordance with the invention. The substrate with deposited $Al_2O_3$ particles was heated to about 125° C. for about 5 minutes in order to bake off solvents in the fluid. The substrates were loaded into a standard tube furnace and subjected to a $POCl_3$ deposition step at about 800° C. for about 20 minutes. No subsequent drive-in step was performed. The process was thus terminated after $P_2O_5$ deposition onto both the crystalline silicon substrate and the deposited silicon fluid areas.

FIG. 8A shows peaks around 1260 $cm^{-1}$ (P=O), 1120 $cm^{-1}$ (P—O), 726 $cm^{-1}$ (P—O—P), and 470 $cm^{-1}$ (O=P—O), typical of $P_2O_5$ and not PSG. In contrast, absorbance spectra 806 in FIG. 8B shows a peak at about 1330 $cm^{-1}$ that is characteristic of P=O (phosphorous oxygen double bonding) and peaks around 450 $cm^{-1}$, 800 $cm^{-1}$, and 1100 $cm^{-1}$ that are characteristic of Si—O, all typical of a deposited PSG film. The absorbance spectra of the $Al_2O_3$ covered substrate 808, corresponding to $P_2O_5$, is substantially greater than the absorbance spectra of the non-covered substrate 806 corresponding to PSG, indicating that there is significantly more $P_2O_5$ embedded in the ink areas than PSG on the non-ink areas. The evidence of significantly more $P_2O_5$ embedded in the ink areas as compared to PSG in the non ink areas is consistent with the larger surface area provided by the ink layer compared with the silicon substrate surface.

While not wishing to be bound by theory, the inventors believe that the substantially larger surface areas of deposited non-silicon-containing particles (in comparison to the relative smaller surface area of the underlying substrate) allows a larger volume of $P_2O_5$ to be deposited compared to the PSG volume formed on the non-ink covered areas of the substrate. However, due to the lack of Si atoms in the non-silicon-containing particle films, the $P_2O_5$ remains substantially unreacted and does not generally result in increased drive-in of phosphorus into the substrate.

Experiment 6

Referring now to FIG. 9, the sheet resistance was measured for two sets of silicon substrates, a first subset covered with deposited $ZrO_2$ particles (patterned) and a second set without deposited $ZrO_2$ particles (non-patterned). Sheet resistance in ohm/sq is shown along the vertical axis 904. All substrates were p-type saw-damage etched, had a thickness of about 180 um and a resistivity of about 2 Ohm-cm.

The substrates were first cleaned with piranha (a mixture of sulfuric acid ($H_2SO_4$) and hydrogen peroxide ($H_2O_2$)). This cleaning was followed by a DI water rinsing step and then a subsequent buffered oxide etch (BOE) dip, followed by a final DI water rinse. Substrates were then dried using $N_2$ prior to the deposition of a set of $ZrO_2$ particles in organic solvents on one side of the substrate.

Substrates were then subjected to baking at a temperature of 125° C. in a baking ambient for a baking time period of about 5 minutes in order to evaporate solvent molecules and to densify the film.

The substrates were then exposed to a dopant source in a diffusion furnace with an atmosphere of $POCl_3$, $N_2$, and $O_2$. All the substrates had an initial deposition temperature of about 800° C. for 20 minutes.

The initial deposition was followed by a drive-in step with drive-in temperature of about 900° for about 25 minutes in an $N_2$ ambient. The residual PSG glass layers on the substrate surface and the densified film surface were subsequently removed by a BOE cleaning step for 5 minutes.

The process resulted in an average pattern region sheet resistance of 384.3 ohm/sq and an average non-pattern region sheet resistance of 127.6 ohm/sq. Consequently, the differential dopant profile between heavily doped and lightly doped regions (as reflected in sheet resistance) is not suited for the formation of a selective emitter as previously described.

For the purposes of this disclosure and unless otherwise specified, "a" or "an" means "one or more." All patents, applications, references and publications cited herein are incorporated by reference in their entirety to the same extent as if they were individually incorporated by reference.

The invention has been described with reference to various specific and illustrative embodiments. However, it should be understood that many variations and modifications may be made while remaining within the spirit and scope of the invention.

For example, although in the experiments described above generally involve a $POCl_3$ process on a boron-doped substrate, the inventors believe that substantially similar results can be achieved with a phosphoric acid ($H_3PO_4$) process on a boron-doped substrate, as well as a $BBr_3$ process on a phosphorous doped substrate. In addition, the silicon-containing particles may also include silicates (e.g. $AlSiO_x$, $Si_xGe_{1-x}$, $SiC_x$, etc.). Furthermore, the silicon-containing particles may be intrinsic or doped.

Advantages of the invention include the production of low cost and efficient junctions for electrical devices, such as solar cells.

Having disclosed exemplary embodiments and the best mode, modifications and variations may be made to the disclosed embodiments while remaining within the subject and spirit of the invention as defined by the following claims.

What is claimed is:

1. A method of forming a multi-doped junction on a substrate, comprising:
   providing the substrate doped with boron atoms, the substrate comprising a front substrate surface;
   depositing an ink on the front substrate surface in an ink pattern, the ink comprising a set of silicon-containing particles and a set of solvents, wherein the set of silicon-containing particles is intrinsic;
   heating the substrate in a baking ambient to a first temperature and for a first time period in order to create a densified film ink pattern;

exposing the substrate to a dopant source in a diffusion furnace with a deposition ambient, the deposition ambient comprising $POCl_3$ gas at a second temperature and for a second time period, wherein a PSG layer is formed on the front substrate surface and on the densified film ink pattern; and heating the substrate in a drive-in ambient to a third temperature and for a third time period;

wherein a first diffused region with a first sheet resistance is formed under the front substrate surface covered by the densified film ink pattern, and a second diffused region with a second sheet resistance is formed under the front substrate surface not covered with the densified film ink pattern, and wherein the first sheet resistance is substantially smaller than the second sheet resistance.

2. The method of claim 1, wherein the first temperature is between about 100° C. and about 600° C. and the first time period is between about 10 seconds and about 20 minutes.

3. The method of claim 1, wherein the first temperature is between about 300° C. and about 500° C. and the first time period is between about 30 seconds and about 3 minutes.

4. The method of claim 1, wherein the first temperature is about 400° C. and the first time period is about 1 minute.

5. The method of claim 1, wherein the deposition ambient comprising $POCl_3$ gas, carrier $N_2$ gas and reactive $O_2$, gas, and wherein a ratio of the carrier $N_2$ gas to the reactive $O_2$ gas is between about 1:1 to about 1.5:1, the second temperature is between about 700° C. and about 1000° C., and the second time period of about 5 minutes and about 35 minutes.

6. The method of claim 1, wherein the second temperature is between about 725° C. and about 850° C., and the second time period is between about 10 minutes and about 35 minutes.

7. The method of claim 1, wherein the second temperature is between about 750° C. and about 825° C., and the second time period is between about 15 minutes and about 30 minutes.

8. The method of claim 1, wherein the second temperature is about 800° C. and the second time period is about 20 minutes.

9. The method of claim 1, wherein the third temperature is between about 850° C. and about 1050° C. and the third time period is between about 10 minutes and about 60 minutes.

10. The method of claim 1, wherein the third temperature is between about 860° C. and about 950° C. and the third time period is between about 15 minutes and about 30 minutes.

11. The method of claim 1, wherein the third temperature is about 875° C. and the third time period is about 25 minutes.

12. The method of claim 1, wherein the first sheet resistance is between about 20 Ohm/sq and about 70 Ohm/sq and the second sheet resistance is between about 70 Ohm/sq and about 140 Ohm/sq.

13. The method of claim 1, wherein the first sheet resistance is between about 30 Ohm/sq and about 60 Ohm/sq and the second sheet resistance is between about 80 Ohm/sq and about 120 Ohm/sq.

14. The method of claim 1, wherein the first sheet resistance is between about 30 Ohm/sq and about 50 Ohm/sq and the second sheet resistance is between about 90 Ohm/sq and about 110 Ohm/sq.

15. The method of claim 1, wherein the baking ambient is one of an inert ambient and an oxidizing ambient.

16. The method of claim 1, wherein the drive-in ambient is one of an inert ambient and an oxidizing ambient.

17. The method of claim 1 including the step of cleaning the substrate after the step of heating the substrate.

18. The method of claim 1, wherein the silicon-containing particle is a silicate.

19. The method of claim 1, wherein the set of silicon-containing particles is intrinsic Si, intrinsic SiOx or intrinsic $Si_xN_y$.

20. The method of claim 1, wherein the set of silicon-containing particles is intrinsic Si.

\* \* \* \* \*